United States Patent [19]
Ichishima et al.

[11] Patent Number: 5,868,850
[45] Date of Patent: Feb. 9, 1999

[54] VAPOR PHASE GROWTH APPARATUS

[75] Inventors: Masahiko Ichishima; Eiichi Toya, both of Yamagata-ken; Tadashi Ohashi, Sagamihara; Masaki Shimada; Shinichi Mitani, both of Numazu; Takaaki Honda, Mishima, all of Japan

[73] Assignees: Toshiba Ceramics Co., Ltd.; Toshiba Kikai Co., Ltd., both of Tokyo, Japan

[21] Appl. No.: 659,498

[22] Filed: Jun. 6, 1996

[30]      Foreign Application Priority Data

Jun. 15, 1995  [JP]  Japan ................................. 7-171609

[51] Int. Cl.⁶ .................................................. C23C 16/00
[52] U.S. Cl. .......................................................... 118/725
[58] Field of Search ............................................ 118/725

[56] References Cited

U.S. PATENT DOCUMENTS 5,063,031  11/1991  Sato ........................................ 118/725

*Primary Examiner*—Richard Bueker
*Attorney, Agent, or Firm*—Foley & Lardner

[57] ABSTRACT

A vapor phase growth unit for vapor phase growing on the surface of a wafer under a heated condition, which supports the wafer with a wafer supporter within a reaction chamber and has a heater under the wafer supported by said wafer supporter, wherein a reflection plate for reflecting at least downward heat from said heater is provided, an insulation cylinder is provided surrounding the side periphery of the heater, and the reflection plate consists of vitreous carbon.

5 Claims, 1 Drawing Sheet

VAPOR PHASE GROWTH APPARATUS

BACKGROUND OF THE INVENTION

1. Field of the Invention

This invention relates to a vapor phase growth apparatus provided with a wafer holding table for supporting a semiconductor wafer in the internal of a reaction chamber and provided with a heater under the wafer supported on the wafer holding table for vapor phase growth on the surface of a wafer under a heated condition.

2. Description of the Related Art

A conventional vapor phase growth apparatus is disclosed in, for example, Japanese Patent Laid-open No. Hei 5-152207. In the vapor phase growth apparatus, a vapor phase growing film is formed by heating with a heating element supported by a wafer holding member and disposed under the wafer holding member. For example, a hollow cylinder extending upward is mounted on the bottom side of the base, and a heater supporter is mounted on the top of the cylinder. Above the heat supporter, a plate-like reflection plate is provided, the heater is accommodated within, and an equalizing plate is disposed at the top thereof. The top of the plate-like reflection plate is positioned above the equalizing plate, and on the top thereof a ring-like wafer holding table is engaged. On the inside periphery of the wafer holding plate, a back facing is formed, where the wafer is disposed.

The atmosphere in the reaction chamber of this vapor phase growth apparatus is reduced in pressure to 50–400 Torr, a large amount of feeding gas such as dichlorosilane and carrier gas such as hydrogen are introduced from the gas inlet, and the vapor phase growing operation is carried out, when the wafer is heated at a temperature of about 1150° C.

A conventional vapor phase growth apparatus has a drawback in that a plate-like Mo reflection plate is provided under a heater, which causes impurity contamination on the heater, resulting in the serious reduction of heater life. This reduced heater life is a disadvantage of the conventional vapor phase growth apparatus. On the other hand, in the case of a reflection plate consisting of SUS and quartz, it is impossible to rinse out with an aqueous solution of $HNO_3$—HF after heat treatment, because the surface of the reflection plate is not resistant to the corrosion with the aqueous solution of $HNO_3$—HF.

SUMMARY OF THE INVENTION

It is an object of the present invention to provide a vapor phase growth apparatus having a reflection plate which maintains the efficiency of reflection with less reduction than conventional even after heat treatment and is acceptable of rinsing out at need with an aqueous solution of $HNO_3$—HF to resume the smooth surface and increase the efficiency of reflection.

In the present invention, the above-mentioned problem is solved by using a vapor phase growth apparatus as claimed in claim 1.

In the present invention, the reflection plate is formed of glassy carbon, and an insulation cylinder is formed of glassy carbon or quartz glass. The surface of a glassy carbon reflection plate is smooth (not rough), and has a high efficiency of reflection. In particular, the reflection plate with a surface roughness of Ra 0.001 to 0.05 $\mu$m has a remarkable efficiency of reflection.

Even if the surface of the reflection plate is deprived of smoothness by heat treatment and the efficiency of reflection is decreased, the surface can be easily rinsed out with an aqueous solution of $HNO_3$—HF because the reflection plate is formed of glassy carbon. The surface of the reflection plate resumes the excellent smoothness, consequently.

The glassy carbon used for the present invention is hard carbon of glass appearance, which can be formed by, for example, solid carbonization of thermosetting resin. Preferable glassy carbon has a bulk density of 1.50 to 1.60 g/cm$^3$, while the bulk density of lower than 1.50 g/cm$^3$ results in the poor efficiency of reflection because of increased porosity. On the other hand, the bulk density of higher than 1.60 g/cm$^3$, which makes no longer hard carbon, results in the reduced yield of wafer because of particle generation. The preferable bending strength of the glassy carbon is 100 MPa or higher, and the bending strength lower than 100 MPa results in deflection and breaking of the reflection plate during treatment of several hundreds of wafers. Furthermore, the preferable specific resistance is in a range from 4000 to 4400 $\mu\Omega$cm, the open porosity is 0.1% or smaller, Shore hardness is 100 or higher, and thermal conductivity is in a range from 5 to 10 W/mK as a reflection plate.

The method for manufacturing of a glassy carbon reflection plate is described referring to an example. First, raw resin (for example furan resin or phenol resin) is molded into a prescribed shape, and thereafter, the molded resin is calcined at 950° C. in a non-oxidative atmosphere. More in detail, furan resin is polymerized with addition of 0.1 part of a polymerization promoter, and casted and molded in a mold. The molded resin is heated to harden at a temperature below 100° C., and thereafter, the hardened resin is subjected to the first processing. Afterward, the processed product is subjected to the first calcination at a temperature of about 1000° C. in a non-oxidative atmosphere followed by the second calcination at a temperature of about 2000° C., then the calcined product is subjected to the second processing, and polished by diamond polishing. The polished product is subjected to the purification treatment at a temperature of 2000° C. or higher in a halogen gas atmosphere.

The surface roughness of the reflection plate of at least a side facing to the heater is preferably Ra 0.001 to 0.05 $\mu$m from the view point of the efficiency of reflection. The efficiency of reflection of lower than Ra 0.001 $\mu$m results in no significant difference and high processing cost by several ten times. The efficiency of reflection of higher than Ra 0.05 $\mu$m results in the poor surface roughness after heat treatment and the remarkably reduced efficiency of reflection.

DETAILED DESCRIPTION OF THE PREFERRED EMBODIMENT

Figure 1:
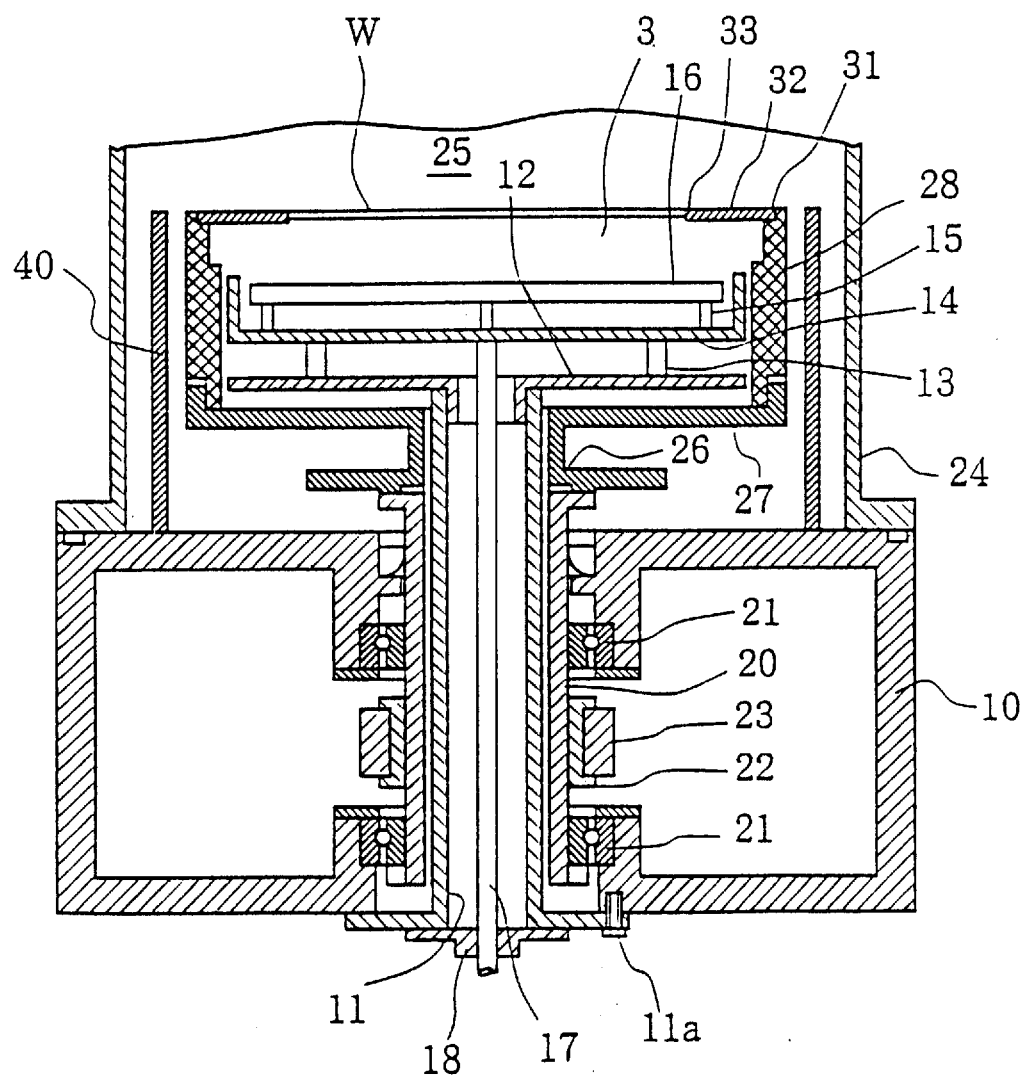
FIG. 1 is a schematic cross-sectional view for illustrating an embodiment of the present invention.

An embodiment is described in detail referring to the drawing hereinafter.

In FIG. 1, on the bottom side of the base 10 is mounted a hollow cylinder 11 extending upward, the top of which is provided with a heater supporter 12. A heater 16 is mounted on the heater supporter 12 through an insulation rod 13, reflection plate 14 and insulater rod 15. The reflection plate 14 is formed of the above-mentioned glassy carbon, comprises a disk-like bottom and a cylindrical side formed integrally with the outer periphery of the disk, and is shaped into a shallow vessel. The bottom end of the hollow cylinder 11 is closed with a cover 18, and a power wiring 17 connected to the heater 16 is provided within the hollow cylinder 11 passing through the cover 18. The heater 16 serves rapid heating to a temperature of 1000° C. or higher.

A hollow rotational shaft 20 is provided surrounding the outside periphery of the hollow cylinder 11, and the hollow rotational shaft 20 is mounted through bearings 21 rotatably on the base 10 independently of the hollow cylinder 11. A pulley 22 is fixed to the hollow rotational shaft 20, which is driven rotationally by a motor not shown in the figure, through a belt 23.

The top end of the hollow rotational shaft 20 extends to the inside of a reaction chamber 25 formed above the top side of the base 10 by a bell jar shown only partially in the figure, and a carbon supporting disk 27 is fixed on the top end of the hollow rotational shaft 20 through keys 26. On the supporting disk 27, a supporting ring 28 consisting of quartz glass, carbon, or ceramics is mounted rotatably and integrally with the supporting disk 27.

The supporting ring 28 extends upward beyond the heater 16 surrounding the heater supporter 12, reflection plate 14 and heater 16.

At the top end of the supporting ring 28, a step 31 is formed, and a ring-like wafer supporter 32 is engaged on the step 31, and a wafer W is supported on a step 33 formed at the upper inside periphery of the wafer supporter 32. The wafer W supported by the wafer supporter 32 is positioned with the prescribed space from the heater 16.

A cylindrical insulation cylinder 40 is placed coaxially outside the supporting ring 28 with a certain gap. The insulation cylinder 40 consists of quartz glass or glassy carbon.

Next, operations of the above-mentioned vapor phase growth unit are described.

The heater 16 is fed with power to heat, the hollow rotational shaft 20 is rotated, and the wafer supporter 32 and wafer W are rotated. The wafer W and wafer supporter 32 are heated by the heater 16.

The wafer supporter 32 serves to support the wafer W so as to maintain a certain gap, and to equalize the temperature distribution over the entire area of the wafer W from the center to the outside periphery by receiving heat from the heater 16 and releasing the heat to heat the peripheral portion of the wafer W to suppress the temperature lowering of the peripheral portion. The wafer is rapidly heated to the prescribed vapor phase growth temperature of, for example, 1000° C. or higher, when a reaction gas is fed from the above in FIG. 1 for vapor phase growth. In this case, vapor phase growing film is formed not only on the surface of the wafer W but also on the surface of the wafer supporter 32. A reflection plate of isotropic carbon generated ducts as compared with a reflection plate of glassy carbon, so that the use of the reflection plate was obliged to stop after growth of only one wafer. On the other hand, the reflection plate of glassy carbon was still usable even after growth of wafers as many as 1000 wafers.

In particular, for a vapor phase growth apparatus which is capable of rapid temperature rising to 800°–1150° C. within 90 seconds, the yield of vapor phase growing film thickness is improved by using a glassy carbon reflection plate according to the present invention.

What is claimed:

1. A vapor phase growth apparatus for vapor phase growing on the surface of a wafer under a heated condition, which supports the wafer with a wafer supporter within a reaction chamber and has a heater under the wafer supported by said wafer supporter, wherein a reflection plate for reflecting at least downward heat from said heater is provided and said reflection plate is made of glassy carbon.

2. The vapor phase growth apparatus as claimed in claim 1, wherein the surface of said reflection plate facing at least to said heater has a surface roughness of Ra 0.001 to 0.05 $\mu$m.

3. The vapor phase growth apparatus as claimed in claim 1, wherein said heater is capable of rapid heating to a temperature of 1000° C. or higher.

4. The vapor phase growth apparatus as claimed in claim 1, wherein said glassy carbon has a bulk density of 1.50 to 1.60 g/cm$^3$ and bending strength of 100 MPa or higher.

5. The vapor phase growth apparatus as claimed in claim 1, wherein said reflection plate comprises components of a disk-like bottom and cylindrical side, and said heater is provided in the cylindrical space formed by the components.

* * * * *